United States Patent
Yang et al.

(10) Patent No.: US 9,068,264 B2
(45) Date of Patent: Jun. 30, 2015

(54) EPITAXIAL GROWTH SYSTEMS

(75) Inventors: Tzu-Ching Yang, Hsinchu (TW); Chung-Ying Chang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 512 days.

(21) Appl. No.: 13/021,330

(22) Filed: Feb. 4, 2011

(65) Prior Publication Data
US 2011/0120376 A1 May 26, 2011

(30) Foreign Application Priority Data
Feb. 4, 2010 (TW) .............................. 99202372 U

(51) Int. Cl.
C23C 16/00 (2006.01)
C23C 16/458 (2006.01)
C30B 25/10 (2006.01)
C30B 25/12 (2006.01)

(52) U.S. Cl.
CPC ......... *C23C 16/4586* (2013.01); *C23C 16/4585* (2013.01); *C30B 25/10* (2013.01); *C30B 25/12* (2013.01)

(58) Field of Classification Search
USPC ................... 118/715–733; 156/345
See application file for complete search history.

(56) References Cited

U.S. PATENT DOCUMENTS

| | | | | |
|---|---|---|---|---|
| 4,641,603 A | * | 2/1987 | Miyazaki et al. | 118/724 |
| 5,062,386 A | * | 11/1991 | Christensen | 118/725 |
| 5,152,842 A | * | 10/1992 | Urata et al. | 118/725 |
| 5,294,778 A | * | 3/1994 | Carman et al. | 219/385 |
| 6,492,625 B1 | * | 12/2002 | Boguslavskiy et al. | 219/486 |
| 7,285,758 B2 | * | 10/2007 | Johnson | 219/411 |

FOREIGN PATENT DOCUMENTS

WO WO-2008152126 A1 12/2008

* cited by examiner

*Primary Examiner* — Keath Chen
(74) *Attorney, Agent, or Firm* — Patterson + Sheridan, LLP

(57) ABSTRACT

Disclosed is about an epitaxial growth system, including an epitaxial growth reactor chamber, a susceptor including a supporting surface and disposed in the epitaxial growth reactor chamber, and a plurality of wafer fixing elements disposed on the supporting surface. The supporting surface of the susceptor includes a rim, and each of the wafer fixing elements includes a boundary. At least three first heating elements are disposed under the susceptor and arranged in parallel to the supporting surface.

14 Claims, 4 Drawing Sheets

EPITAXIAL GROWTH SYSTEMS

REFERENCE TO RELATED APPLICATION

This application claims the right of priority based on Taiwan application Ser. No. 099202372, filed on Feb. 4, 2010, and the content of which is hereby incorporated by reference.

TECHNICAL FIELD

The disclosure relates to an epitaxial growth system, and more particularly to an epitaxial growth system with high heating uniformity.

DESCRIPTION OF BACKGROUND ART

The semiconductor optoelectronic devices contribute to data transmission and energy conversion along with the advance of technology. For example, the semiconductor optoelectronics devices can be applied in systems such as the optical fiber communication, optical storage, military system, and the like. In general, the processes of forming semiconductor optoelectronic devices include forming wafers, growing epitaxy layers, growing thin films, diffusion/ion implantation, photolithography, etching, and the like.

In the described processes, growing epitaxy layers are generally performed by a chemical vapor deposition (CVD) system or a molecular beam epitaxy (MBE) system. The CVD system is preferred in this industry because of its faster production rate compared with the MBE system.

FIG. 1 shows a cross-sectional diagram of major parts of a conventional epitaxial growth system-chemical vapor deposition system 1 for semiconductor optoelectronic devices. In system 1, a base plate 101 is combined with an enclosure 102 to form a sealed reactor chamber 103. A susceptor 104 is contained in the reactor chamber 103. The susceptor 104 has a horizontal supporting surface 105 with a plurality of wafer fixing elements (not shown) thereon. The wafer fixing elements fix a plurality of wafers 106 on the supporting surface 105, and the fixed wafers 106 can be subsequently processed by epitaxial growth. In addition, several inductive coils 107 are disposed under the supporting surface 105 to heat the wafers thereon. The inductive coils 107 are supplied with electricity, and thereby form an electromagnetic induction to heat the wafer 106 on the susceptor 104. In this system, the inductive coils 107 are arranged in curve relative to the supporting surface 105. Therefore, the wafers 106 can be uniformly heated by the inductive coils 107. In other words, a rotation device 108 is set as a reference to separate the inductive coils 107 to left and right parts. The remote portion of the inductive coils 107 (far away from the reference) are apart from the supporting surface 105 with a shorter distance, and the center portion of the inductive coils 107 (near the reference) are apart from the supporting surface 105 with a larger distance. In addition, the rotation device 108 is connected to the center of the susceptor 104 such that the susceptor 104 can be rotated. Therefore, the wafers 106 fixed on different locations of the susceptor 104 can be heated with higher uniformity. The internal part of the rotation device 108 can be further connected to a gas line 109, thereby connecting to an external gas supply system. The gas line is used to input a gas to the reactor chamber for the epitaxial growth. Simultaneously, the susceptor 104 is rotated by the rotation device 108, and uniformly heated by the lower heating system. Afterwards, an epitaxy layer is formed on the surface of the wafers 106.

In the conventional epitaxial growth system 1 for semiconductor optoelectronic devices, the upper wafers 106 are heated by electromagnetic induction of the inductive coils 107. The inductive coils 107 are arranged in curve related to the supporting surface 105. The curved degree of the arrangement is defined by the distance between the inductive coils 107 and the upper wafers 106, and the density of the arrangement is defined by the distance of the inductive coils therebetween. The temperature uniformity depends on the curved degree and the density of the arrangement so the temperature tuning is quite complicated. When the device material and/or the epitaxy reaction temperature are changed, the whole arrangement of the inductive coils 107 has to be correspondingly tuned. Moreover, if the temperature uniformity of the wafers 106 is tuned by increasing/decreasing the applied electromagnetic energy, the temperature is dramatically interfered with the circumstance temperature. In short, it is difficult to control the heating uniformity of the wafers 106.

SUMMARY OF THE DISCLOSURE

The present disclosure provides several epitaxial growth systems.

An epitaxial growth system in accordance with an embodiment of the disclosure includes an epitaxial growth reactor chamber; a susceptor disposed in the epitaxial growth reactor chamber, wherein the susceptor includes a supporting surface having a rim; a plurality of wafer fixing elements disposed on the supporting surface, and each of the wafer fixing elements has a boundary; and at least three first heating elements disposed under the susceptor and arranged in parallel to the supporting surface.

An epitaxial growth system in accordance with an embodiment of the disclosure includes an epitaxial growth reaction chamber; a susceptor disposed in the epitaxial growth reaction chamber, wherein the susceptor includes a supporting surface having a rim; a plurality of wafer fixing elements disposed on the supporting surface, and each of the wafer fixing elements has a boundary; and a plurality of first heating elements disposed under the susceptor, and each of the first heating elements being apart from the supporting surface with a substantially similar first distance; and a second heating element disposed under the susceptor, and outside the first heating element proximal to the rim of the supporting surface, wherein the second heating element and the supporting surface have a second distance less than the first distance.

DETAILED DESCRIPTION OF PREFERRED EMBODIMENTS

The embodiments are described hereinafter in accompany with drawings.

Figure 1:
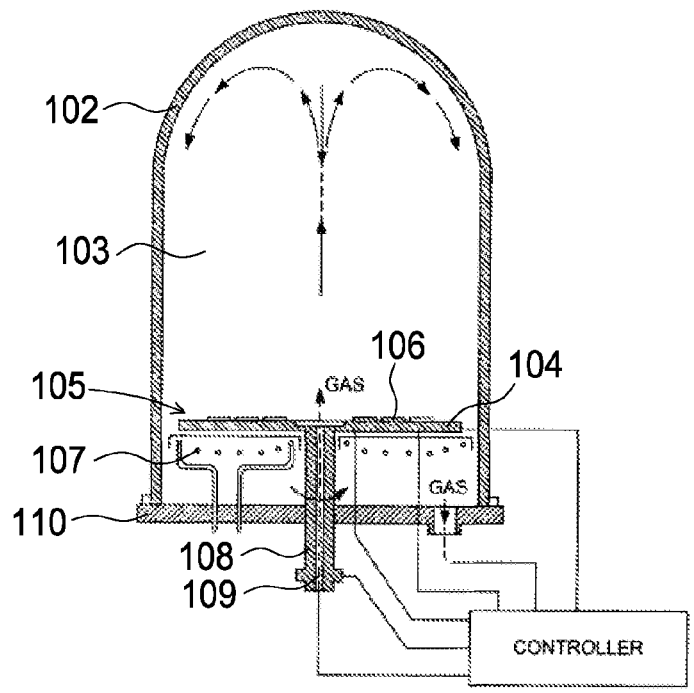
FIG. 1 illustrates a conventional epitaxial growth system for semiconductor optoelectronic devices.
Figure 2:
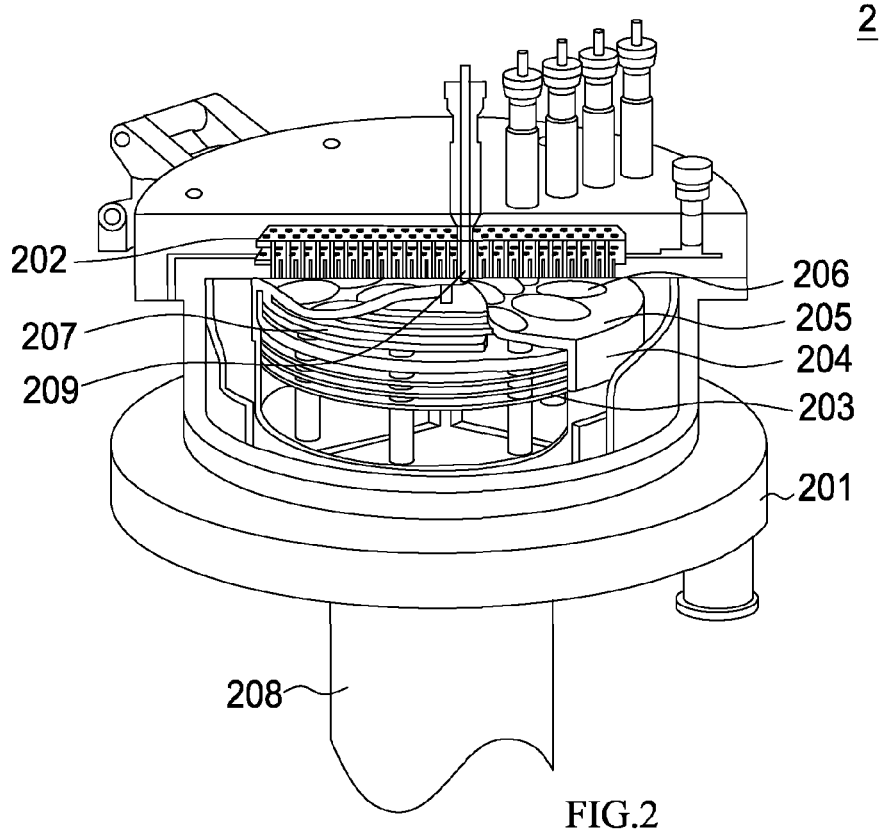
FIG. 2 illustrates an epitaxial growth system for semiconductor optoelectronic devices in accordance with an embodiment of the disclosure.

FIG. 2 shows a major reactor part of an epitaxial growth system 2 for semiconductor optoelectronic devices in one embodiment of the disclosure. In the epitaxial growth system 2, a base plate 201 is combined with an enclosure 202 to form a sealed reactor chamber 203. The epitaxial growth is performed in the reactor chamber 203. A susceptor 204 is contained in the reactor chamber 203. The susceptor 204 has a horizontal supporting surface 205 with a plurality of wafer fixing elements (not shown) thereon. The wafer fixing elements fix a plurality of wafers 206 on the supporting surface 205. Several first heating elements 207 are disposed under the supporting surface 205 of the epitaxial growth system 2, and the first heating elements 207 are substantially arranged in parallel to the supporting surface 205. For example, the first heating elements can be tungsten heating lines and the like. The temperature of the tungsten heating lines is increased during a heating process, such that a temperature difference is occurred between the tungsten heating lines and the upper susceptor 204. The heat can be transferred from the first heating elements 207 to the susceptor 204 by convection and/or radiation. Because the heating process is based on the temperature difference, the temperature control of the upper susceptor is easier. As a result, the arrangement of the first heating elements 207 can be simple, and there is no need to have a complicated geometry shape (e.g. curve in FIG. 1). Furthermore, the first heating elements 207 can be optionally connected to different temperature controllers (not shown) set by segment, thereby heating the first heating elements 207 to different temperatures, respectively. The temperature of the first heating elements 207 can be directly tuned by different temperature controllers to uniformly heating the wafers 206. Similarly, the rotation device 208 set in geometry center of the susceptor 204 may rotate the susceptor 204, and the wafers 206 on different locations of the susceptor 204 are heated with higher uniformity. The internal part of the reactor chamber 203 can be further connected to gas lines 209, thereby connecting to an external gas supply system. The gas lines 209 are used to input a gas to the reactor chamber 203 for the epitaxial growth. Simultaneously, the susceptor 204 is rotated by the rotation device 208, and uniformly heated by the lower heating system. Afterwards, an epitaxy layer is formed on the surface of the wafers 206.

Figure 3:
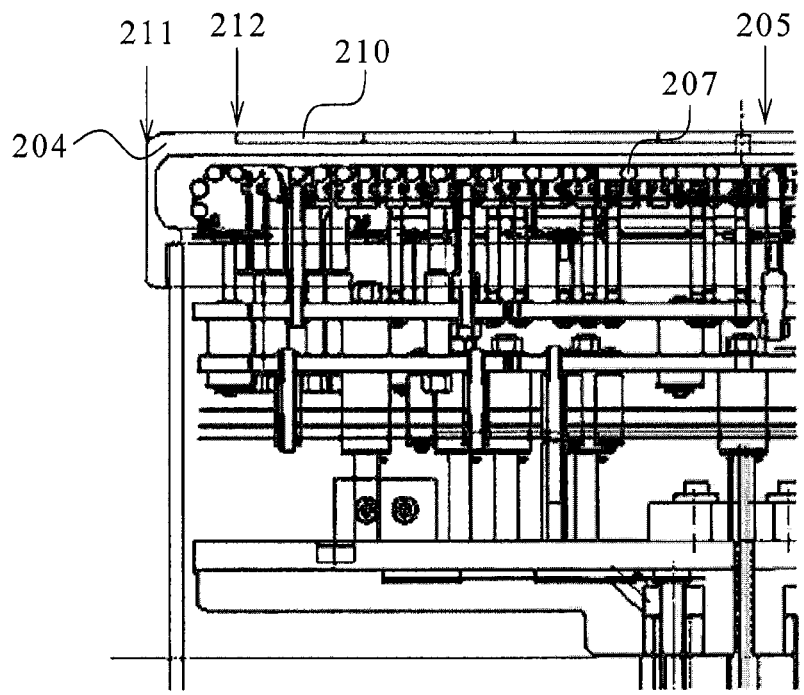
FIG. 3 illustrates a partial enlarged diagram of an epitaxial growth system for semiconductor optoelectronic devices in accordance with an embodiment of the disclosure.

FIG. 3 shows a partial enlarged diagram of the epitaxial growth system 2 in one embodiment of the disclosure. Obviously, the susceptor 204 includes a supporting surface 205, and the first heating elements 207 are disposed under and arranged in parallel to the susceptor 204. The epitaxial growth system efficiency is determined by the number of the wafers fixed on the supporting surface 205 per process. In other words, the wafers should be arranged in densest way to occupy the maximum area of the supporting surface 205. Accordingly, if the boundary 212 of the wafer fixing elements 210 and the rim 211 of the supporting surface 205 are closer, the utilization of the surface area of the susceptor 204 is higher.

Figures 4A, 4B:
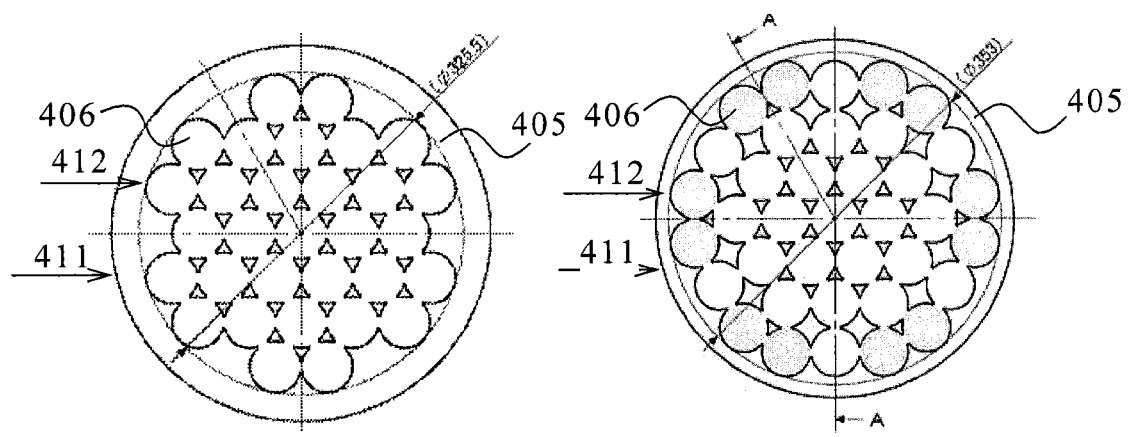
FIGS. 4A-4B illustrate partial top views of susceptors of epitaxial growth systems for semiconductor optoelectronic devices in accordance with embodiments of the disclosure.

FIG. 4A shows a top view of a supporting surface 405 in one embodiment of the disclosure. Several wafers 406 are disposed on the supporting surface 405 for epitaxial growth. In this manner, wafer fixing elements (not shown) are disposed on the supporting surface 405, such as cavities corresponding to a wafer shape, to hold and fix the wafers.

For enhancing the surface area utilization of the susceptor, FIG. 4B shows a top view of another supporting surface 405 in one embodiment of the disclosure. The wafers 406 are much densely arranged on the supporting surface 405 for epitaxial growth. In this manner, wafer fixing elements (not shown) are disposed on the supporting surface 405, such as cavities corresponding to a wafer shape, to hold and fix the wafers. The difference between FIGS. 4A and 4B is the number of wafers on the supporting surface. The area utilization of the susceptor 405 in FIG. 4B is higher than that of FIG. 4A. The number of wafers 406 is thirty-one in FIG. 4A and thirty-seven in FIG. 4B, respectively. In FIG. 4B, the boundary 412 of the outermost wafer fixing element is closer to the rim 411 of the supporting surface 405. In other word, the wafers occupy more area of the supporting surface 405 in FIG. 4B.

Figure 5A:
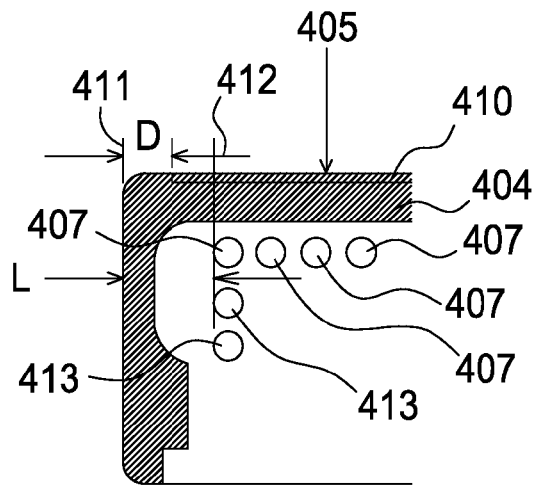
FIGS. 5A-5H illustrate partial enlarged diagrams of heating parts of epitaxial growth systems for semiconductor optoelectronic devices in accordance with embodiments of the disclosure.
Figure 5B:
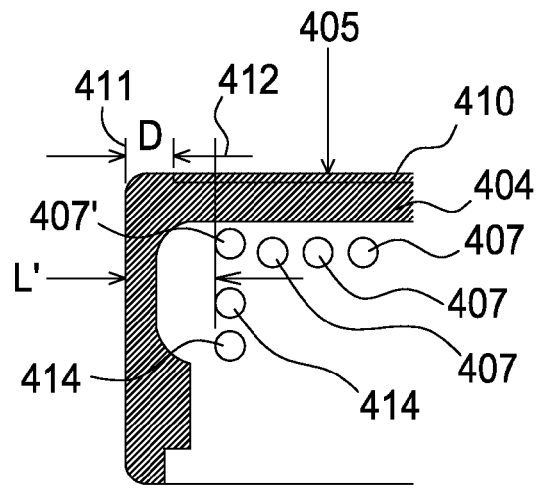

FIGS. 5A and 5B show different heating structures corresponding to the embodiment shown in FIG. 4B. As described above, the boundary 412 of the outermost wafer fixing element 410 should be close to the rim 411 of the supporting surface 405 so the area utilization of the susceptor surface is improved. However, the susceptor 404 has an unavoidable thickness. The first heating element 407 and the susceptor 404 must have a safety distance to prevent the first heating element 407 from damaging the susceptor 404 during heating process. FIG. 5A shows part of the heating structure close to the rim 411 of the supporting surface 405. In FIG. 5A, a wafer fixing element 410 is disposed on the supporting surface 405, and the wafer fixing element 410 has a closest approach (e.g. boundary 412) to the rim 411 of the supporting surface 405, wherein the boundary 412 and the rim 411 have a minimum distance D. Several first heating elements 407, four in this embodiment, are disposed under the susceptor 404 and arranged in parallel to the supporting surface 405. Considering the sidewall thickness of the susceptor 404 and the safety distance between the first heating elements 407 and the susceptor 404, the first heating element 407 and the rim 411 should have a minimum distance L. Because the sidewall of the susceptor limits the location of the first heating element 407, the minimum distance L cannot be less than the minimum distance D. As proven in experiments, the difference between the minimum distances L and D is less than or equal to 5 mm and greater than or equal to 0, in the condition of the minimum distance L greater than or equal to the minimum distance D, so the outermost part of the wafers (i.e. the boundary 412 of the wafer fixing element 410) are sufficiently heated for the epitaxial growth. Moreover, several second heating elements 413 can be further disposed under the first heating elements 407 and arranged vertically to the supporting surface 405. The second heating elements 413 may assist in providing heat to the side of the susceptor, such that the temperature of the side of the susceptor and the whole temperature uniformity are less influenced by the radiated cooling in the circumstance. Note that the first heating elements 407 and the second heating elements 413 can be selectively heated by different temperature controllers, respectively, such that the wafers has higher heating uniformity due to different temperature adjustment by segment. In this embodiment, the susceptor 404 can be a thermally conductive material, such as silicon carbide, graphite, boron nitride, or combinations thereof. The first and/or second heating elements can be a thermally stable material, such as tungsten heating lines.

FIG. 5B shows part of the heating structure close to the rim 411 of the supporting surface 405 in another embodiment of the disclosure. In FIG. 5B, a wafer fixing element 410 is disposed on the supporting surface 405, and the wafer fixing element 410 has a closest approach (e.g. boundary 412) to the rim 411 of the supporting surface 405, wherein the boundary 412 and the rim 411 have a minimum distance D. Several first heating elements 407, three in this embodiment, are disposed under the susceptor 404 and arranged in parallel to the supporting surface 405. In addition, a second heating element 407' is further disposed near the rim 411 of the supporting surface 405. Compared with the first heating element 407, the second heating element 407' is closer to the supporting surface 405. Therefore, the upper wafers near the rim 411 can be sufficiently heated by the closer heating source (e.g. the second heating element 407').

Moreover, several third heating elements 414 can be further disposed under the second heating elements 407' and arranged vertically to the supporting surface 405. The third heating elements 414 may assist in providing heat to the side of the susceptor, such that the temperature of the side of the susceptor and the whole temperature uniformity are less influenced by the radiated cooling in the circumstance. Note that the first heating elements 407, the second heating element 407', and the third heating elements 413 can be selectively heated by different temperature controllers, respectively, such that the wafers has higher heating uniformity due to different temperature adjustment by segment. Similarly, considering the sidewall thickness of the susceptor 404 and the safety distance between the second heating element 407' and the susceptor 404, the second heating element 407' and the rim 411 should have a minimum distance L'. Because the sidewall of the susceptor limits the location of the second heating element 407', the minimum distance L' cannot be less than the minimum distance D. As proven in experiments, the difference between the minimum distances L' and D is less than or equal to 5 mm and greater than or equal to 0, in the condition of the minimum distance L' greater than or equal to the minimum distance D. In those experiments, the outermost part of the wafers and the rim 411 of the wafer fixing element 410 are sufficiently heated to process the epitaxial growth. In this embodiment, the susceptor 404 can be a thermally conductive material, such as silicon carbide, graphite, boron nitride, or combinations thereof. The first, second, and/or third heating elements can be a thermally stable material, such as tungsten heating lines.

Figure 5C:
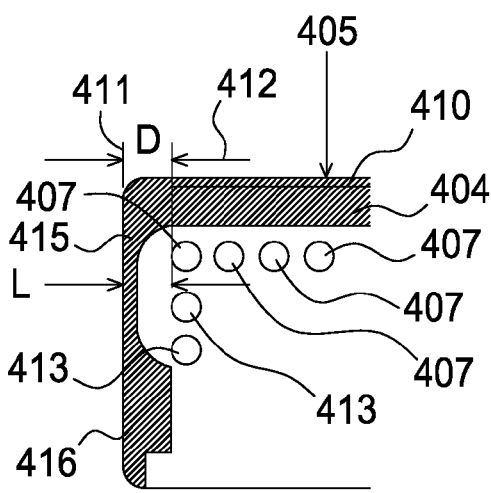
Figure 5D:
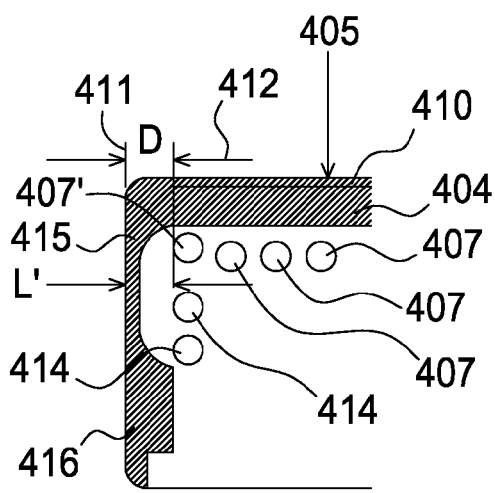

As shown in the described embodiments, the boundary 412 of the wafer fixing elements and the rim 411 of the supporting surface have a minimum distance D, and the first heating element may align with the boundary 412 of the wafer fixing elements. Preferably, D is a minimum value and L is equal to D. When the distance D between the outermost boundary 412 of the wafer fixing element 410 and the rim 411 of the supporting surface is minimized, it is dangerous to dispose the first heating element 407 under the susceptor 404 and aligning to the rim 411 of the supporting surface. The danger is caused by lack of the safety distance between the sidewall of the susceptor 404 and the first heating element 407. To overcome the safety problems, the described system is further adjusted in other embodiments. As shown in FIGS. 5C and 5D, part of the sidewall 415 of the susceptor 404 corresponding to the outermost first heating element 407 (or second heating element 407') is thinner than another part of the sidewall 416 of the susceptor 404 distanced away from the thinner part of the sidewall 415 and not corresponding to the outermost first heating element 407 (or second heating element 407'). As such, the outermost first heating element 407 (or second heating element 407') can be disposed farther to align the boundary 412 of the wafer fixing elements. Therefore, the wafers surface is heated with higher uniformity.

Figure 5E:
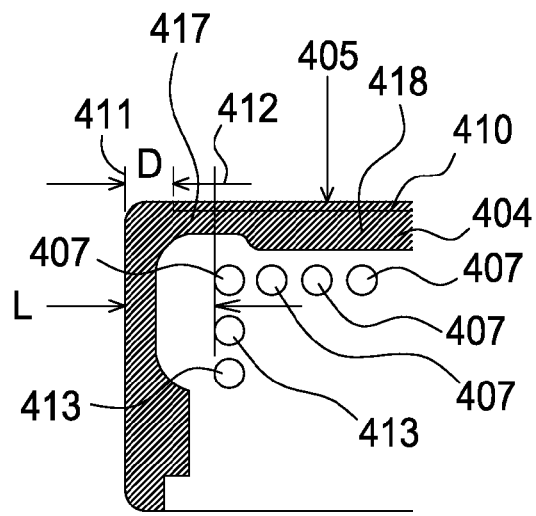
Figure 5F:
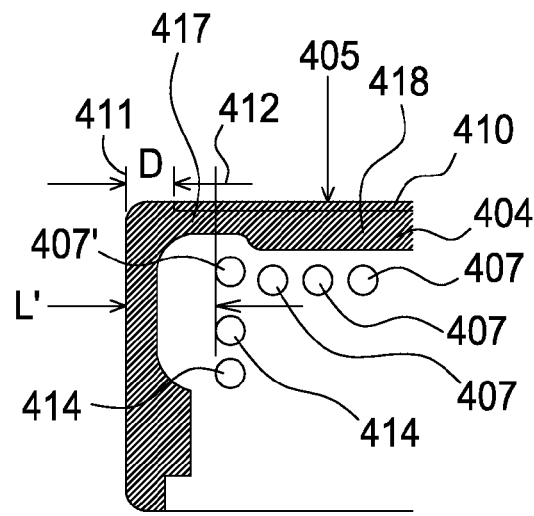
Figure 5G:
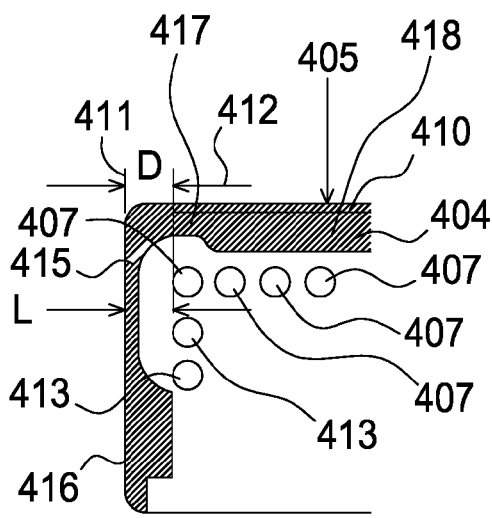

In other embodiment, an edge part 417 of the susceptor 404 corresponding to the outermost first heating element 407 is thinner than another part 418 of the susceptor 404, as shown in FIG. 5E. Similarly, an edge part 417 of the susceptor 404 corresponding to the second heating element 407' is thinner than another part 418 of the susceptor 404, as shown in FIG. 5F. The thinner edge part 417 (as shown in FIGS. 5E-5F) can be combined with the thinner sidewall 415 (as shown in FIGS. 5C-5D) to form the susceptors 404 as shown in FIGS. 5G-5H.

Figure 5H:
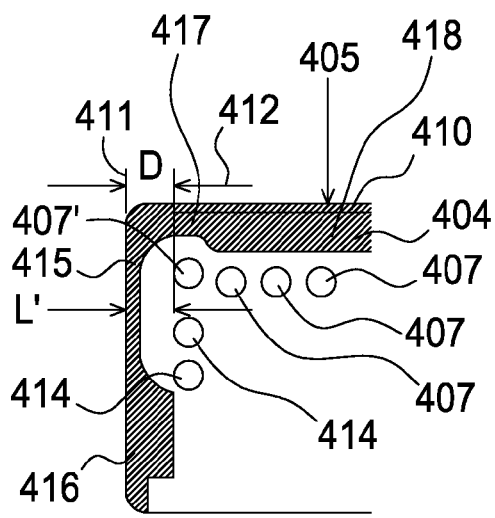

More specifically, with reference to FIG. 5H, three first heating elements 407 are disposed under the susceptor 404 and arranged in parallel to the supporting surface 405. Each of the first heating elements 407 is apart from the supporting surface 405 with a first distance and the first distance for each of the first heating elements 407 to the supporting surface 405 are substantially the same. The second heating element 407' is disposed near the rim 411 of the supporting surface 405, and compared with the first heating element 407, the second heating element 407' is closer to the supporting surface 405. Moreover, several third heating elements 414 are disposed under the second heating elements 407' and arranged in a direction vertically to the supporting surface 405. The third heating elements 414 may assist in providing heat to the side of the susceptor 404, such that the temperature of the side of the susceptor 404 and the whole temperature uniformity are less influenced by the radiated cooling in the circumstance. The wafer fixing element 410 is disposed on the supporting surface 405, and the wafer fixing element 410 has a closest approach (e.g. boundary 412) to the rim 411 of the supporting surface 405, wherein the boundary 412 and the rim 411 have a minimum distance D. The second heating element 407' and the rim 411 should have a minimum distance L'.

In the disclosure, the first heating elements are disposed under and arranged in parallel to the susceptor, such that the upper wafers can be directly heated with higher uniformity. In addition, the wafers can be effectively arranged on the supporting surface by adjusting the relative position of the lower heating element boundary and the upper wafer fixing element boundary. In conclusion, the disclosure improves the mass production.

The foregoing description has been directed to the specific embodiments of this disclosure. It is apparent; however, that other alternatives and modifications may be made to the embodiments without escaping the spirit and scope of the disclosure.

What is claimed is:

1. An epitaxial growth system, comprising:
    an epitaxial growth reactor chamber;
    a susceptor disposed in the epitaxial growth reactor chamber, wherein the susceptor includes a top surface and a side surface;
    a plurality of wafer fixing elements disposed on the top surface, and each of the wafer fixing elements has a boundary;
    a plurality of first heating elements under the susceptor arranged in parallel to the top surface; and
    a plurality of second heating elements disposed under the outermost first heating element and no other heating elements disposed within the susceptor, wherein the first and the second heating elements are independently controllable.

2. The system as claimed in claim 1, further comprising a rotation device connected to a geometry center of the susceptor.

3. The system as claimed in claim 1, further comprising a plurality of gas input elements disposed in the epitaxial growth reactor chamber for providing process gases during an epitaxy process.

4. The system as claimed in claim 1, wherein the first and second heating elements are heated by different heating devices, respectively.

5. The system as claimed in claim 1, wherein the susceptor comprises:
   a first sidewall corresponding to the outermost first heating element; and
   a second sidewall not corresponding to the outermost first heating element; wherein the first sidewall is thinner than the second sidewall.

6. The system as claimed in claim 1, wherein an edge part of the susceptor corresponding to an outermost first heating element of the first heating elements is thinner than a part of the susceptor not corresponding to the outermost first heating element.

7. The system as claimed in claim 1, wherein a second minimum distance between the second heating element and the side surface is greater than or equal to a first minimum distance between the boundary of the outermost wafer fixing element and the side surface; and a difference between the first minimum distance and the second minimum distance is less than or equal to 5 mm.

8. The system as claimed in claim 1, wherein each of the first heating elements is apart from the top surface with a first distance, and the first distances of the first heating elements are substantially the same.

9. An epitaxial growth system, comprising:
   an epitaxial growth reactor chamber;
   a susceptor disposed in the epitaxial growth reactor chamber, wherein the susceptor includes a top surface and a side surface;
   a plurality of wafer fixing elements disposed on the top surface, and each of the wafer fixing elements having a boundary; and
   a plurality of first heating elements being apart from the top surface with a first distance; wherein the first distances of the first heating elements are substantially the same;
   a second heating element being apart from the top surface with a second distance less than the first distance; and
   a plurality of third heating elements directly under the second heating element, and no other heating elements are disposed within the susceptor, wherein the first, the second and the third heating elements are independently controllable.

10. The system as claimed in claim 9, wherein a second minimum distance between the second heating element and the side surface is greater than or equal to a first minimum distance between the boundary of the outermost wafer fixing element and the side surface; and a difference between the first minimum distance and the second minimum distance is less than or equal to 5 mm.

11. The system as claimed in claim 9, further comprising a rotation device connected to a geometry center of the susceptor.

12. The system as claimed in claim 9, further comprising a plurality of gas input elements disposed in the epitaxial growth reactor chamber for providing process gases during an epitaxy process.

13. The system as claimed in claim 9, wherein the first and the third heating elements are heated by different heating devices, respectively.

14. The system as claimed in claim 9, wherein the susceptor comprises:
   a first sidewall corresponding to the second heating element; and
   a second sidewall not corresponding to the second heating element;
wherein the first sidewall is thinner than the second sidewall.

* * * * *